US011428749B2

(12) United States Patent
Gupta et al.

(10) Patent No.: US 11,428,749 B2
(45) Date of Patent: Aug. 30, 2022

(54) POWER SUPPLY MONITORING WITH VARIABLE THRESHOLDS FOR VARIABLE VOLTAGE RAILS

(71) Applicant: Hamilton Sundstrand Corporation, Charlotte, NC (US)

(72) Inventors: Vikas Gupta, Madhya Pradesh (IN); Veerasamy Vasudevan, Tamilnadu (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 393 days.

(21) Appl. No.: 16/782,240

(22) Filed: Feb. 5, 2020

(65) Prior Publication Data

US 2021/0165050 A1 Jun. 3, 2021

(30) Foreign Application Priority Data

Nov. 28, 2019 (IN) .............................. 201911048849

(51) Int. Cl.
*G01R 31/40* (2020.01)
*G01R 19/165* (2006.01)
*G05B 17/02* (2006.01)

(52) U.S. Cl.
CPC ......... *G01R 31/40* (2013.01); *G01R 19/1659* (2013.01); *G05B 17/02* (2013.01)

(58) Field of Classification Search
CPC .... G01R 31/40; G01R 19/1659; G05B 17/02; Y02D 10/00; G06F 1/3296; G06F 1/28
See application file for complete search history.

(56) References Cited

U.S. PATENT DOCUMENTS

| 6,693,781 | B1 * | 2/2004 | Kroker ...................... G06F 1/30 361/78 |
| 7,902,800 | B2 | 3/2011 | Jain et al. |
| 10,250,418 | B2 | 4/2019 | Kyles et al. |
| 10,425,007 | B2 | 9/2019 | Tang et al. |
| 2004/0049703 | A1 | 3/2004 | Maksimovic et al. |
| 2005/0251700 | A1 | 11/2005 | Henerson et al. |
| 2006/0259840 | A1 | 11/2006 | Abadeer et al. |

(Continued)

OTHER PUBLICATIONS

European Search Report Issued in European Application No. 20205942.4-1216 dated Apr. 26, 2021; 12 Pages.

*Primary Examiner* — Chad G Erdman
(74) *Attorney, Agent, or Firm* — Cantor Colburn LLP

(57) ABSTRACT

Provided are embodiments for power supply monitoring with variable thresholds for variable voltage vails. An example method includes determining a proportionality factor based on a reference voltage value of a reference voltage and a rail voltage value of a rail voltage. The method further includes monitoring the rail voltage by a power supply monitoring circuit comprising a first resistor, a second resistor, and a third resistor, wherein the power supply monitoring circuit monitors the rail voltage based on the reference voltage to determine, by the power supply monitoring circuit, whether one of an under voltage condition or an over voltage condition occurs. The method further includes, responsive to a processor commanding a change in the rail voltage value of the rail voltage, causing, by the processor, a new reference voltage value to be generated based on the proportionality factor to adjust an under voltage threshold and an over voltage threshold.

18 Claims, 3 Drawing Sheets

(56) References Cited

U.S. PATENT DOCUMENTS

2011/0204925 A1* 8/2011 Barrenscheen ....... G06F 1/3203
327/74
2016/0291625 A1 10/2016 Tripathi et al.
2016/0380544 A1* 12/2016 Zapata .............. H02M 3/33592
363/21.02

* cited by examiner

| V_Rail (V) | Acceptable Tolerance (%) | UV Threshold (V) | OV Threshold (V) | R1 (Ω) | R2 (Ω) | R3 (Ω) | Calculated V_Ref (V) | V_Ref/V_Rail |
|---|---|---|---|---|---|---|---|---|
| 1 | 5 | 0.950 | 1.05 | 1450.00 | 150.00 | 1450.00 | 0.50 | 0.5 |
| 0.9 | 5 | 0.855 | 0.945 | 1450.00 | 150.00 | 1450.00 | 0.45 | 0.5 |
| 0.8 | 5 | 0.760 | 0.84 | 1450.00 | 150.00 | 1450.00 | 0.40 | 0.5 |
| 0.7 | 5 | 0.665 | 0.735 | 1450.00 | 150.00 | 1450.00 | 0.35 | 0.5 |
| 0.6 | 5 | 0.570 | 0.63 | 1450.00 | 150.00 | 1450.00 | 0.30 | 0.5 |

*FIG. 2*

POWER SUPPLY MONITORING WITH VARIABLE THRESHOLDS FOR VARIABLE VOLTAGE RAILS

CROSS REFERENCE TO RELATED APPLICATION

This application claims the benefit of Indian Patent Application No. 201911048849, filed Nov. 28, 2019, which is incorporated herein by reference in its entirety.

BACKGROUND

Embodiments described herein generally relate to power supply monitoring circuits, and more specifically to a power supply monitor with variable thresholds for variable voltage rails.

An embedded system serves a dedicated purpose, usually as a component of an electrical or electro-mechanical system. Embedded systems typically include processors, such as microprocessors and/or microcontrollers, to perform tasks. Some processors utilize variable core voltage for operation. In such cases, a voltage used by the processor can vary/change while the processor is operating.

BRIEF DESCRIPTION

According to an embodiment, a method is provided. The method includes determining a proportionality factor based on a reference voltage value of a reference voltage and a rail voltage value of a rail voltage. The method further includes monitoring the rail voltage by a power supply monitoring circuit includes a first resistor, a second resistor, and a third resistor, wherein the power supply monitoring circuit monitors the rail voltage based on the reference voltage to determine, by the power supply monitoring circuit, whether one of an under voltage condition or an over voltage condition occurs. The method further includes responsive to a processor commanding a change in the rail voltage value of the rail voltage, causing, by the processor, a new reference voltage value to be generated based on the proportionality factor to adjust an under voltage threshold and an over voltage threshold.

In addition to one or more of the features described herein, or as an alternative, further embodiments include that the reference voltage is generated by a digital-to-analog converter controlled by the processor.

In addition to one or more of the features described herein, or as an alternative, further embodiments include that the rail voltage is generated by a dynamic voltage scaling regulator controlled by the processor.

In addition to one or more of the features described herein, or as an alternative, further embodiments include that determining whether the under voltage condition occurs is based on the following equation:

$$V\_Rail < V\_Rail\_UV\_Thd$$

where V_Rail is the rail voltage value and V_Rail_UV_Th is the under voltage threshold.

In addition to one or more of the features described herein, or as an alternative, further embodiments include that it is determined that the under voltage condition has occurred when the rail voltage is less than the under voltage threshold.

In addition to one or more of the features described herein, or as an alternative, further embodiments include that the under voltage threshold is defined by the following equation:

$$V\_Rail\_UV\_Th = V\_Ref \times \left(\frac{R1 + R2 + R3}{R3}\right)$$

where V_Rail_UV_Th is the under voltage threshold, V_Ref is the reference voltage value, R1 is a value of the first resistor, R2 is a value of the second resistor, and R3 is a value of the third resistor.

In addition to one or more of the features described herein, or as an alternative, further embodiments include that it is determined that the over voltage condition has occurred when the rail voltage is greater than the over voltage threshold.

In addition to one or more of the features described herein, or as an alternative, further embodiments include that the over voltage threshold is defined by the following equation:

$$V\_Rail\_OV\_Th = V\_Ref \times \left(\frac{R1 + R2 + R3}{R2 + R3}\right)$$

where V_Rail_OV_Th is the over voltage threshold, V_Ref is the reference voltage value, R1 is a value of the first resistor, R2 is a value of the second resistor, and R3 is a value of the third resistor.

In addition to one or more of the features described herein, or as an alternative, further embodiments include that a value of the third resistor is a selected value.

In addition to one or more of the features described herein, or as an alternative, further embodiments include that a value of the second resistor is calculated based on the reference voltage value, a current leak value through the third resistor, the rail voltage value, an under voltage threshold, and the value of the third resistor.

In addition to one or more of the features described herein, or as an alternative, further embodiments include that a value of the first resistor is calculated based on the rail voltage value, the current leak value through the third resistor, the value of the second resistor, and the value of the third resistor.

In addition to one or more of the features described herein, or as an alternative, further embodiments include that the power supply monitoring circuit further includes a first comparator and a second comparator.

According to another embodiment, a system is provided that includes a processor, a dynamic voltage scaling regulator controlled by the processor and generating a rail voltage at a rail voltage value, a digital-to-analog converter controlled by the processor and generating a reference voltage at a reference voltage value, and a power supply monitoring circuit that includes a first resistor, a second resistor, and a third resistor. The power supply monitoring circuit monitors the rail voltage based on the reference voltage to determine, by the power supply monitoring circuit, whether one of an under voltage condition or an over voltage condition occur. The processor causes the digital-to-analog converter to vary the reference voltage value by the proportionality factor to adjust an under voltage threshold and an over voltage threshold responsive to the processor causing the dynamic voltage scaling regulator to change the rail voltage value of the rail voltage.

In addition to one or more of the features described herein, or as an alternative, further embodiments include that determining whether the under voltage condition occurs is based on the following equation:

$$V\_Rail < V\_Rail\_UV\_Th$$

where VV_Rail is the rail voltage value and V_Rail_UV_Th is the under voltage threshold.

In addition to one or more of the features described herein, or as an alternative, further embodiments include that it is determined that the under voltage condition has occurred when the rail voltage is less than the under voltage threshold.

In addition to one or more of the features described herein, or as an alternative, further embodiments include that the under voltage threshold is defined by the following equation:

$$V\_Rail\_UV\_Th = V\_Ref \times \left(\frac{R1 + R2 + R3}{R3}\right)$$

where V_Rail_UV_Th is the under voltage threshold, V_Ref is the reference voltage value, R1 is a value of the first resistor, R2 is a value of the second resistor, and R3 is a value of the third resistor.

In addition to one or more of the features described herein, or as an alternative, further embodiments include that determining whether the over voltage condition occurs is based on the following equation:

$$V_{Rail} > V\_Rail\_OV\_Th$$

where V_Rail is the rail voltage value and V_Rail_UV_Th is the under voltage threshold.

In addition to one or more of the features described herein, or as an alternative, further embodiments include that it is determined that the over voltage condition has occurred when the rail voltage is greater than the over voltage threshold.

In addition to one or more of the features described herein, or as an alternative, further embodiments include that the over voltage threshold is defined by the following equation:

$$V\_Rail\_OV\_Th = V\_Ref \times \left(\frac{R1 + R2 + R3}{R2 + R3}\right)$$

where V_Rail_OV_Th is the over voltage threshold, V_Ref is the reference voltage value, R1 is a value of the first resistor, R2 is a value of the second resistor, and R3 is a value of the third resistor.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIG. 2 depicts a table of over voltage threshold values and under voltage threshold values and required reference voltage for under voltage and over voltage detection according to one or more embodiments described herein.

DETAILED DESCRIPTION

Figure 1:
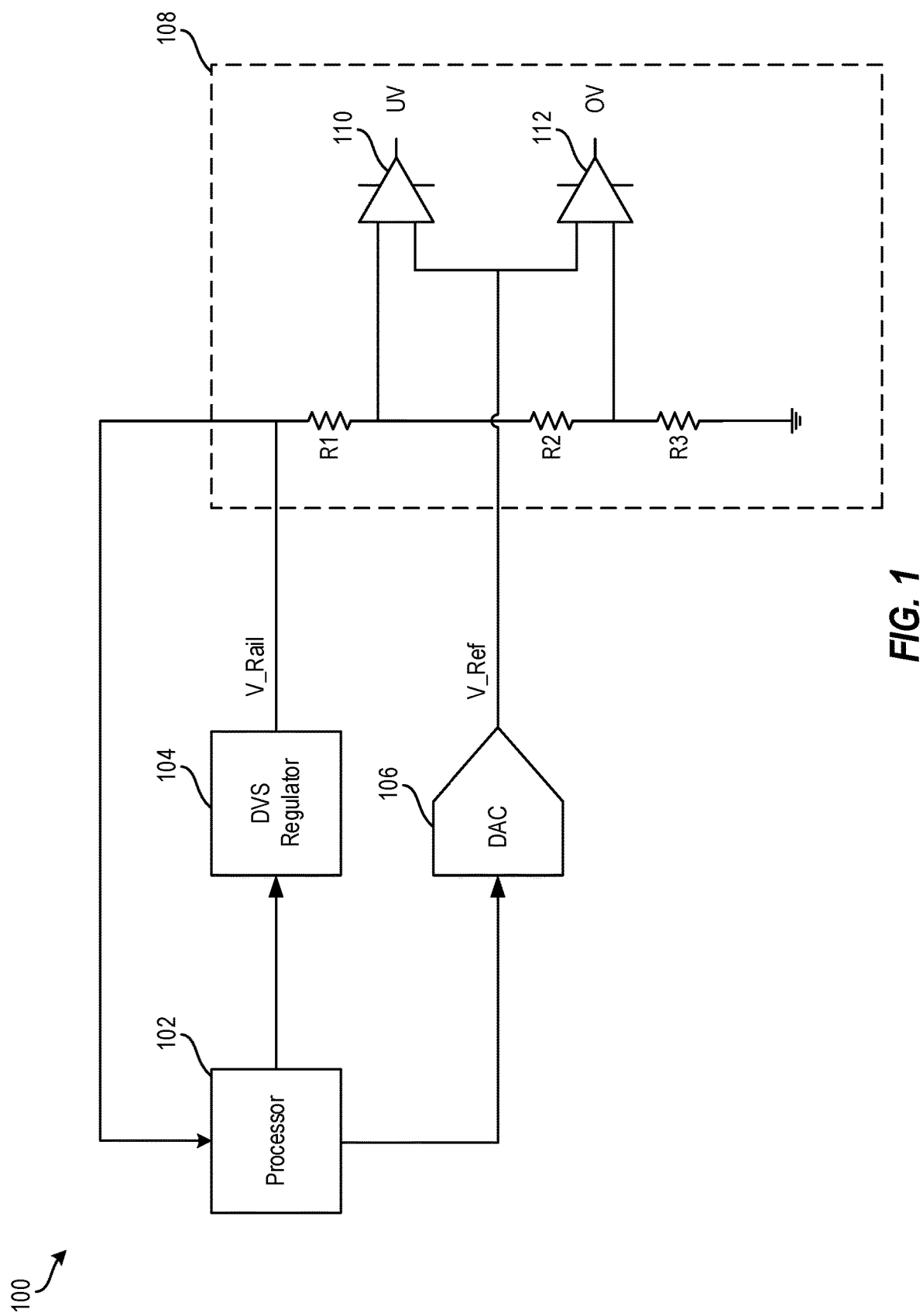
FIG. 1 depicts a block diagram of a circuit for power supply monitoring with variable thresholds for variable voltage rails according to one or more embodiments described herein.

Some existing processors utilize variable core voltage for operation. In such cases, the core voltage required by the processor can change while the processor is operating. This is referred to as "dynamic voltage scaling" (DVS). Embodiments described herein monitor the variable core voltage rail and detect over voltage (OV) and under voltage (UV) conditions for the variable core voltage rail. Further, embodiments described herein can adjust OV and UV thresholds of the monitoring circuit dynamically as output voltage varies.

DVS helps in reducing the power consumption of embedded systems, which include processors. This is accomplished by reducing the switching losses of the embedded system by selectively reducing the frequency and voltage of the system, where power loss is equal to ½*current*voltage$^2$*frequency. According to this formula, reducing the voltage by half reduces the power loss by a factor of four. The processor typically communicates and controls the settings of a voltage regulator to implement DVS. However, not all voltage regulators can be used to implement DVS. Suitable DVS regulators can have digital interfaces (i.e., serial voltage identification (SVID)/power management bus (PMBus)) through which the processor can communicate with the DVS regulator and thereby control the output of the DVS regulator. The processor can determine the ideal core voltage needed for its operation at any given time and controls the DVS regulator accordingly.

Conventional power supply monitoring utilizes a comparator-based circuit, which is used to detect over voltage and under voltage conditions of monitored voltage rails. The UV/OV condition can cause different problems ranging from damaging integrated circuits to causing unreliable operation of the integrated circuits. Conventionally, a resistor divider output of the voltage rail is compared with a reference voltage and the OV and UV conditions are determined if the sampled voltage is above or below the reference voltage. When a UV or OV condition is detected, the voltage monitoring circuit sends a UV or OV signal to the processor (or a field programmable gate array (FPGA), for example), which can take an action, such as lowering/raising the voltage or shutting down.

Conventional power supply monitoring circuits include fixed resistor dividers and fixed reference voltages. This is not suitable for monitoring the output of DVS regulators since the voltage rail varies in these regulators.

Embodiments described herein provide a technique to vary the reference voltage proportional to the desired rail voltage. This ensures that the UV threshold and the OV threshold of the monitoring circuit also vary as the rail voltage varies.

To do this, the embodiments described herein provide a circuit and method for power supply monitoring with variable thresholds for variable voltage rails. In particular, embodiments described herein monitor a variable core voltage rail associated with a processor and detect OV and UV conditions for the variable core voltage rail by dynamically adjusting the OV and UV thresholds of the power supply monitor circuit. To do this, the described embodiments utilize a digital-to-analog converter (DAC) to provide a varying reference voltage to a power supply monitoring circuit. The reference voltage is proportional to a desired output voltage of the variable core voltage rail. The DAC is controlled by the same processor that controls a dynamic voltage scaling regulator in some embodiments.

Turning now to the figures, FIG. 1 depicts a circuit diagram of a circuit 100 for power supply monitoring with variable thresholds for variable voltage rails according to one or more embodiments described herein. The circuit 100 includes a processor 102, a DVS regulator 104, a DAC 106, and a power supply monitoring circuit 108 configured and arranged as shown.

The processor 102 determines an ideal value of a core voltage and instructs the DVS regulator 104 and the DAC 106 of the value. The processor 102 can send information/commands, such as the ideal value of the core voltage, to the DVS regulator 104 using any suitable communication interface. As one such example, the interface between the processor 102 and the DVS regulator 104 is SVID/PMBus, although the present disclosure is not limited to such interface. The processor 102 commands the DAC 106 to generate core voltage multiplied by proportionality factor, which is the reference voltage to the power supply monitor circuit 108 using any suitable communication interface as well. For example, the interface between the processor 102 and the DAC 106 can be a serial peripheral interface (SPI) or an inter-integrated circuit (I2C) interface, although other interfaces can also be implemented.

Calculating the resistor values R1, R2, and R3 occurs as follows. First, a value for R3 is chosen, such as between 1 kΩ to 50 kΩ for example. It should be appreciated that any suitable value for R3 can be chosen. Using the chosen R3 value, the values of R1 and R2 are calculated as follows. First, a current leakage value I_Leak through the resistor R3 is calculated as follows using the chosen value of R3:

$$I\_Leak = \frac{V\_Ref}{R3} \times \frac{V\_Rail}{V\_Rail\_OV\_Threshold},$$

where V_Ref is the comparator reference voltage (i.e., the output of the DAC 106), V_Rail is the regulator output voltage (i.e., the output of the DVS regulator 104), and V_Rail_OV_Threshold is the desired over voltage threshold value for the regulator output (i.e., the output of the DVS regulator 104).

Once the current leakage value I_Leak is calculated, it is used to calculate the value of R2 using the following equation:

$$R2 = \left(\frac{V\_Ref}{I\_Leak} \times \frac{V\_Rail}{V\_Rail\_UV\_Threshold}\right) - R3,$$

where V_Rail_UV_Threshold is the desired under voltage threshold value for the regulator output (i.e., the output of the DVS regulator 104).

Finally, the value of R1 is calculated using the values of R2 and R3 as follows:

$$R1 = \left(\frac{V\_Rail}{I\_Leak}\right) - (R2 + R3).$$

An under voltage occurs when the following is true:

$$V\_UVin = V\_Rail \times \left(\frac{R2 + R3}{R1 + R2 + R3}\right) < V\_Ref.$$

That is, an under voltage occurs when the rail voltage value is less than the under voltage threshold.

An over voltage occurs when the following is true:

$$V\_OVin = V\_Rail \times \left(\frac{R3}{R1 + R2 + R3}\right) < V\_Ref.$$

That is, an over voltage occurs when the rail voltage value is greater than the over voltage threshold.

The upper threshold value for the over voltage condition for any voltage rail value is defined by the following equation:

$$V\_Rail\_OV\_Th = V\_Ref \times \left(\frac{R1 + R2 + R3}{R2 + R3}\right).$$

The upper threshold value for the under voltage condition for any voltage rail value is defined by the following equation:

$$V\_Rail\_UV\_Th = V\_Ref \times \left(\frac{R1 + R2 + R3}{R3}\right).$$

An example of such results is depicted in the table of FIG. 2. In particular, FIG. 2 depicts a table 200 of over voltage threshold values and under voltage threshold values according to one or more embodiments described herein. In this example, the table 200 includes values for the following: a desired rail voltage (V_Rail) for different voltage rails; an acceptable tolerance of V_Rail; different over voltage and under voltage thresholds; resistor values of resistors R1, R2, R3 of FIG. 1; a calculated reference voltage (V_Ref), and a proportionality factor, which is the ratio of V_Ref to V_Rail (i.e., V_Ref/V_Rail).

As seen from the table 200, the V_Ref calculated value is proportional to the V_Rail value. In this example, the proportionality factor is 0.5, but can vary in examples. Thus, by varying the V_Ref voltage, UV and OV detection for different rails can be implemented. Since the proportionality factor is fixed, the processor 102 can command the DAC 106 to generate V_Ref such that V_Ref=V_Rail*proportionality factor.

Figure 3:
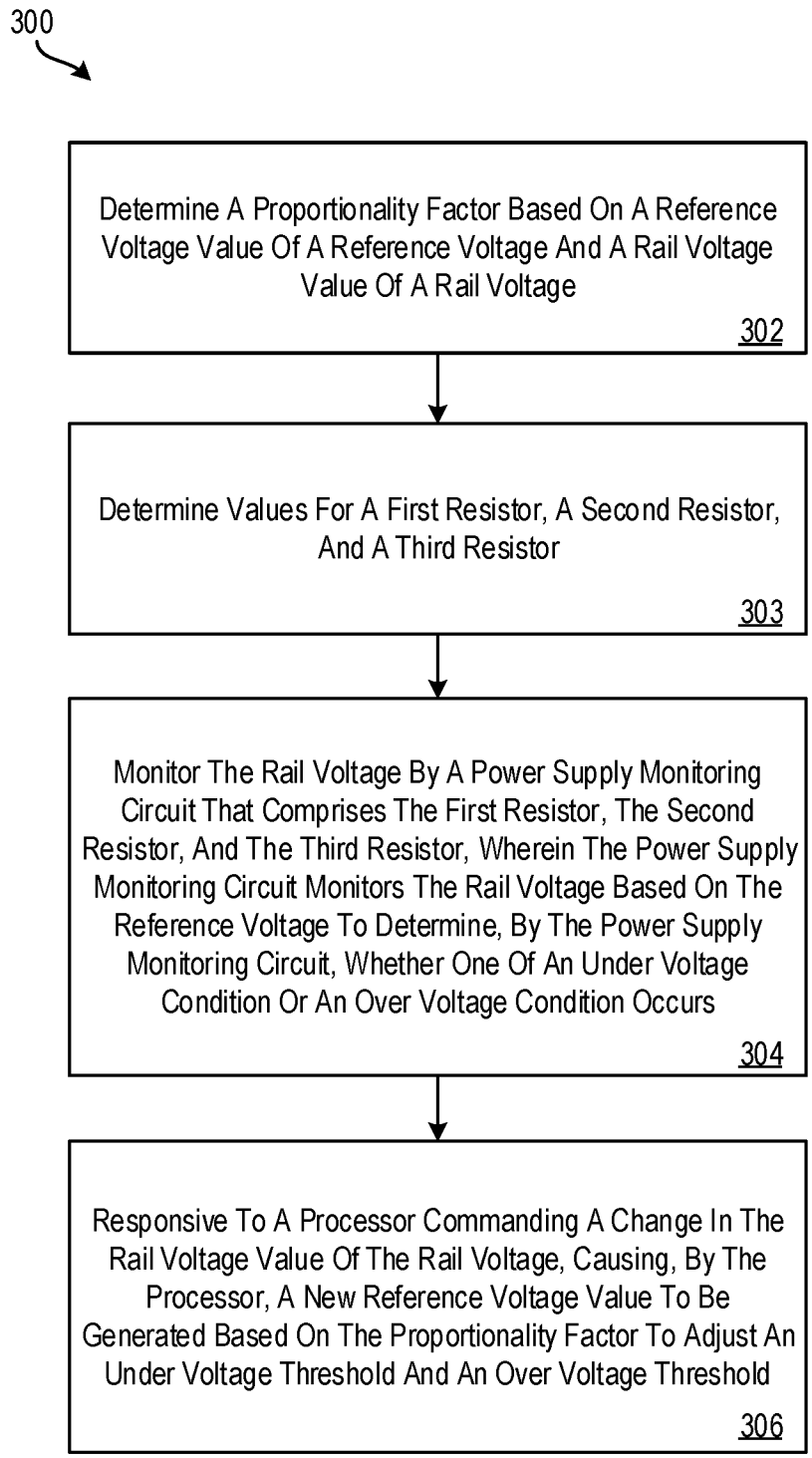
FIG. 3 depicts a flow diagram of a method for power supply monitoring according to one or more embodiments described herein.

FIG. 3 depicts a flow diagram of a method 300 for power supply monitoring according to one or more embodiments described herein. The features and functionality of the method 300 are now described with reference to the circuit 100 of FIG. 1 as an example but are not so limited. The method 300 varies the under voltage and over voltage thresholds as the rail voltage varies. The UV/OV thresholds for a particular rail voltage need not be the same for another particular rail voltage. So the intent of the circuit 100 is to vary the reference voltage to the power supply monitoring circuit 108 is to vary the reference voltage to the power supply monitoring circuit 108 simultaneously as the rail voltage varies (while maintaining constant proportionality between the rail voltage and the reference voltage) so that the power supply monitoring circuit 108 can adjust its UV/OV thresholds. Since the processor 102 determines and sets the rail voltage, and since the processor 102 also controls the DAC 106, the processor 102 can control the DAC 106 to generate the necessary reference voltage to maintain the proportionality between the rail voltage and the reference voltage. This way, even as the rail voltage varies (or as OV/UV thresholds vary), the power supply monitoring circuit 108 is able to detect the over voltage and under voltage conditions.

At block 302, a proportionality factor is determined based on a reference voltage value of a reference voltage V_Ref (i.e., the output of the DAC 106) and a rail voltage value of a rail voltage V_Rail (i.e., the output of the DVS 104). As in the example of the table 200 of FIG. 2, the proportionality factor is a ratio of the V_Ref to V_Rail (e.g., 0.5).

At block 303, the values of the first, second, and third resistors (i.e., the resistors R1, R2, R3) are determined as described herein. For example, a value of the third resistor is a selected value. Next, the second resistor is calculated based on the reference voltage value, a current leak value through the third resistor, the rail voltage value, an under voltage threshold, and the value of the third resistor. Then, the value of the first resistor is calculated based on the rail voltage value, the current leak value through the third resistor, the value of the second resistor, and the value of the third resistor.

At block 304, the power supply monitoring circuit 108 monitors the rail voltage based on the reference voltage to determine whether one of an under voltage condition or an over voltage condition occurs. The power supply monitoring circuit 108 includes resistors R1, R2, R3 and comparators 110, 112 configured and arranged as shown in the example of FIG. 1.

At block 306, responsive to the processor 102 commanding a change in the rail voltage value of the rail voltage, the processor 102 causes the DAC 106 to vary the reference voltage value by the proportionality factor to adjust the UV and OV thresholds. That is, as the processor 102 commands the DVS regulator 104 to generate a new rail voltage, the processor 102 simultaneously commands the DAC 106 to vary the reference voltage by the proportionality factor to adjust the UV and OV thresholds. For example, the processor 102 causes the DAC 106 to increase or decrease its output (i.e., V_Ref) to maintain the proportionality factor and thereby adjust the UV and OV thresholds.

Additional processes also may be included, and it should be understood that the process depicted in FIG. 3 represents an illustration, and that other processes may be added or existing processes may be removed, modified, or rearranged without departing from the scope of the present disclosure.

The technical effects and benefits include improving processors (e.g., the processor 102) by reducing power consumption in processor cores. As another example. Additional technical effects and benefits include ensuring the DVS regulator generates correct voltage output as required. For example, error in output voltage could be due to miscommunication/invalid data between the processor and the DVS regulator, failure of the DVS regulator, overshoot/undershoot, and other transient errors. The embodiments described herein ensure the DVS regulator generates the correct voltage to avoid the problems.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method comprising:
   determining a proportionality factor based on a reference voltage value of a reference voltage and a rail voltage value of a rail voltage;
   monitoring the rail voltage by a power supply monitoring circuit comprising a first resistor, a second resistor, and a third resistor, wherein the power supply monitoring circuit monitors the rail voltage based on the reference voltage to determine, by the power supply monitoring circuit, whether one of an under voltage condition or an over voltage condition occurs;
   and responsive to a processor commanding a change in the rail voltage value of the rail voltage, causing, by the processor, a new reference voltage value to be generated based on the proportionality factor to adjust an under voltage threshold and an over voltage threshold
   wherein the reference voltage is generated by a digital-to-analog converter controlled by the processor;
   wherein the reference voltage is generated by a digital-to-analog converter controlled by the processor;
   wherein the rail voltage is generated by a dynamic voltage scaling regulator controlled by the processor.

2. The method of claim 1, wherein determining whether the under voltage condition occurs is based on the following equation:

$$\text{V\_Rail} < \text{V\_Rail\_UV\_Th}$$

where V_Rail is the rail voltage value and V_Rail_UV_Th is the under voltage threshold.

3. The method of claim 2, wherein it is determined that the under voltage condition has occurred when the rail voltage is less than the under voltage threshold.

4. The method of claim 3, wherein the under voltage threshold is defined by the following equation:

$$\text{V\_Rail\_UV\_Th} = \text{V\_Ref} \times \left( \frac{R1 + R2 + R3}{R3} \right)$$

where V_Rail_UV_Th is the under voltage threshold, V_Ref is the reference voltage value, R1 is a value of the first resistor, R2 is a value of the second resistor, and R3 is a value of the third resistor.

5. The method of claim 1, wherein determining whether the over voltage condition occurs is based on the following equation:

$$V_{Rail} > \text{V\_Rail\_OV\_Th}$$

where V_Rail is the rail voltage value and V_Rail_UV_Th is the under voltage threshold.

6. The method of claim 5, wherein it is determined that the over voltage condition has occurred when the rail voltage is greater than the over voltage threshold.

7. The method of claim 6, wherein the over voltage threshold is defined by the following equation:

$$V\_Rail\_OV\_Th = V\_Ref \times \left(\frac{R1 + R2 + R3}{R2 + R3}\right)$$

where V_Rail_OV_Th is the over voltage threshold, V_Ref is the reference voltage value, R1 is a value of the first resistor, R2 is a value of the second resistor, and R3 is a value of the third resistor.

8. The method of claim 1, wherein a value of the third resistor is a selected value.

9. The method of claim 8, wherein a value of the second resistor is calculated based on the reference voltage value, a current leak value through the third resistor, the rail voltage value, an under voltage threshold, and the value of the third resistor.

10. The method of claim 9, wherein a value of the first resistor is calculated based on the rail voltage value, the current leak value through the third resistor, the value of the second resistor, and the value of the third resistor.

11. The method of claim 1, wherein the power supply monitoring circuit further comprises a first comparator and a second comparator.

12. A system comprising:
   a processor;
   a dynamic voltage scaling regulator controlled by the processor and generating a rail voltage at a rail voltage value;
   a digital-to-analog converter controlled by the processor and generating a reference voltage at a reference voltage value;
   and a power supply monitoring circuit comprising a first resistor, a second resistor, and a third resistor, wherein the power supply monitoring circuit monitors the rail voltage based on the reference voltage to determine, by the power supply monitoring circuit, whether one of an under voltage condition or an over voltage condition occurs,
   wherein the processor determines a proportionality factor based on the reference voltage value of the reference voltage and the rail voltage value of the rail voltage, and wherein the processor causes the digital-to-analog converter to vary the reference voltage value by the proportionality factor to adjust an under voltage threshold and an over voltage threshold responsive to the processor causing the dynamic voltage scaling regulator to change the rail voltage value of the rail voltage.

13. The system of claim 12, wherein determining whether the under voltage condition occurs is based on the following equation:

V_Rail<V_Rail_UV_Th where VV_Rail is the rail voltage value and V_Rail_UV_Th is the under voltage threshold.

14. The system of claim 13, wherein it is determined that the under voltage condition has occurred when the rail voltage is less than the under voltage threshold.

15. The system of claim 14, wherein the under voltage threshold is defined by the following equation:

$$V\_Rail\_UV\_Th = V\_Ref \times \left(\frac{R1 + R2 + R3}{R3}\right)$$

where V_Rail_UV_Th is the under voltage threshold, V_Ref is the reference voltage value, R1 is a value of the first resistor, R2 is a value of the second resistor, and R3 is a value of the third resistor.

16. The system of claim 12, wherein determining whether the over voltage condition occurs is based on the following equation:

$V_{Rail}$>V_Rail_OV_Th where V_Rail is the rail voltage value and V_Rail_UV_Th is the under voltage threshold.

17. The system of claim 16, wherein it is determined that the over voltage condition has occurred when the rail voltage is greater than the over voltage threshold.

18. The system of claim 17, wherein the over voltage threshold is defined by the following equation:

$$V\_Rail\_OV\_Th = V\_Ref \times \left(\frac{R1 + R2 + R3}{R2 + R3}\right)$$

where V_Rail_OV_Th is the over voltage threshold, V_Ref is the reference voltage value, R1 is a value of the first resistor, R2 is a value of the second resistor, and R3 is a value of the third resistor.

* * * * *